United States Patent
Oh et al.

(10) Patent No.: US 7,405,029 B2
(45) Date of Patent: *Jul. 29, 2008

(54) ANTIREFLECTIVE HARDMASK COMPOSITION AND METHODS FOR USING SAME

(75) Inventors: Chang Il Oh, Kyoungki-do (KR); Dong Seon Uh, Seoul (KR); Do Hyeon Kim, Kyoungki-do (KR); Jin Kuk Lee, Kyoungki-do (KR); Irina Nam, Kyoungki-do (KR); Hui Chan Yun, Daegukwangyeok-si (KR); Jong Seob Kim, Daejeonkwangyeok-si (KR)

(73) Assignee: Cheil Industrial, Inc. (KR)

( * ) Notice: Subject to any disclaimer, the term of this patent is extended or adjusted under 35 U.S.C. 154(b) by 198 days.

This patent is subject to a terminal disclaimer.

(21) Appl. No.: 11/325,281

(22) Filed: Jan. 4, 2006

(65) Prior Publication Data

US 2007/0072111 A1  Mar. 29, 2007

(30) Foreign Application Priority Data

Sep. 26, 2005 (KR) .................. 10-2005-0089089

(51) Int. Cl.
G03C 1/73 (2006.01)
G03C 1/76 (2006.01)
G03F 7/095 (2006.01)

(52) U.S. Cl. ................. 430/270.1; 430/271.1
(58) Field of Classification Search ........... 430/270.1, 430/271.1, 272.1, 313, 316, 317, 318, 325, 430/326, 329, 914, 919, 920, 921, 925

See application file for complete search history.

(56) References Cited

U.S. PATENT DOCUMENTS

| | | | |
|---|---|---|---|
| 5,420,233 A | 5/1995 | Isogai et al. | |
| 5,886,102 A | 3/1999 | Sinta et al. | |
| 5,939,236 A | 8/1999 | Pavelchek et al. | |
| 6,607,988 B2 * | 8/2003 | Yunogami et al. | 438/720 |
| 2003/0113662 A1 * | 6/2003 | Kato et al. | 430/270.1 |
| 2005/0119421 A1 * | 6/2005 | Schindler et al. | 525/452 |
| 2006/0019195 A1 * | 1/2006 | Hatakeyama et al. | 430/270.1 |
| 2006/0251990 A1 | 11/2006 | Uh et al. | |
| 2006/0269867 A1 | 11/2006 | Uh et al. | |
| 2007/0003863 A1 | 1/2007 | Uh et al. | |
| 2007/0059635 A1 * | 3/2007 | Oh et al. | 430/270.1 |
| 2007/0154658 A1 | 7/2007 | Kang et al. | |

FOREIGN PATENT DOCUMENTS

| | | |
|---|---|---|
| CA | 1204547 | 5/2006 |
| JP | 1-293339 | 11/1989 |
| JP | 06-136122 | 5/1994 |
| JP | 9-146100 | 6/1997 |
| JP | 11-084391 | 3/1999 |

* cited by examiner

Primary Examiner—Cynthia H. Kelly
Assistant Examiner—Anca Eoff
(74) Attorney, Agent, or Firm—Myers Bigel Sibley & Sajovec

(57) ABSTRACT

Hardmask compositions having antireflective properties useful in lithographic processes, methods of using the same, and semiconductor devices fabricated by such methods, are provided. Antireflective hardmask compositions of the invention include:
(a) a polymer component including at least one polymer having a monomeric unit of Formula (I)

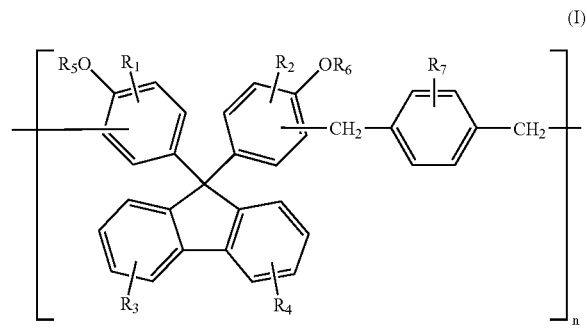

wherein $R_1$ and $R_2$ may each independently be hydrogen, hydroxyl, $C_{1-10}$ alkyl, $C_{6-10}$ aryl, allyl, or halo; $R_3$ and $R_4$ may be each independently be hydrogen, a crosslinking functionality, or a chromophore; $R_5$ and $R_6$ may each independently be hydrogen or an alkoxysiloxane having the structure of Formula (II), wherein at least one of $R_5$ and $R_6$ is an alkoxysilane;

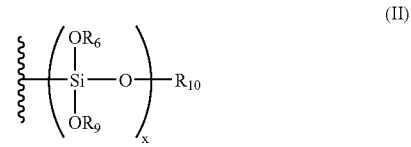

wherein $R_8$, $R_9$, and $R_{10}$ may each independently be a hydrogen, alkyl, or aryl; and x is 0 or a positive integer; $R_7$ may be hydrogen, $C_{1-10}$ alkyl, $C_{6-10}$ aryl, or allyl; and n is a positive integer;
(b) a crosslinking component; and
(c) an acid catalyst.

12 Claims, No Drawings

ANTIREFLECTIVE HARDMASK COMPOSITION AND METHODS FOR USING SAME

CROSS-REFERENCE TO RELATED APPLICATION

This application claims priority under 35 U.S.C. §119 from Korean Patent Application No. 10-2005-0089089, filed on Sep. 26, 2005, in the Korean Intellectual Property Office, the disclosure of which is incorporated by reference herein as if set forth in its entirety.

FIELD OF THE INVENTION

The present invention relates to hardmask compositions having antireflective properties useful in lithographic processes, and more particularly to hardmask compositions including polymers having strong absorbance in the short wavelength region (e.g., 157, 193 and 248 nm) of the electromagnetic spectrum.

BACKGROUND OF THE INVENTION

Due to the continuous demand for smaller microelectronic devices, there exists a need to reduce the size of structural shapes in microelectronics and other related industries. Toward this end, effective lithographic techniques are essential to achieve a reduction in the size of microelectronic structures.

Typical lithographic processes involve pattern-wise exposure of a photosensitive resist to radiation in order to form a patterned resist layer. Thereafter, the resulting image may be developed by contacting the exposed resist layer with a suitable developing substance (e.g. an aqueous alkaline developing solution) to remove certain portions of the resist pattern. The material underlying the resist may then be etched through the openings in the resist to transfer a pattern to an underlying substrate. After the pattern is transferred, the remaining portions of the resist may then be removed.

For better resolution in lithography, an antireflective coating (ARC) may be used to minimize the reflectivity between an imaging layer, such as a photosensitive resist, and an underlying layer. However, in some lithographic imaging processes, the resist does not provide sufficient etch resistance to effectively transfer the desired pattern to a layer underlying the resist. Therefore, a so-called hardmask layer may be applied as an intermediate layer between the patterned resist layer and the underlying material to be patterned. The hardmask layer receives the pattern from the patterned resist layer and should be able to withstand the etching processes needed to transfer the pattern to the underlying material.

Although a number of hardmask materials are known, there is a need for improved hardmask compositions. Since conventional hardmask materials are often difficult to apply to substrates, the use of chemical and physical vapor deposition, special solvents, and/or high-temperature baking may be required. A hardmask composition that may be applied by spin-coating techniques, and which does not require high-temperature baking, would be desirable. A hardmask composition that can be easily etched selective to the overlying photoresist, while being resistant to the etch process needed to pattern the underlying layer, would also be desirable. A hardmask composition that provides superior storage properties and avoids unwanted interactions with an imaging resist layer would further be desirable. A hardmask composition that is particularly resistant to radiation at shorter wavelengths, such as 157, 193, and 247 nm, would also be desirable.

SUMMARY OF THE INVENTION

In some embodiments of the present invention, antireflective hardmask compositions include
(a) a polymer component including at least one polymer having a monomeric unit of Formula (I)

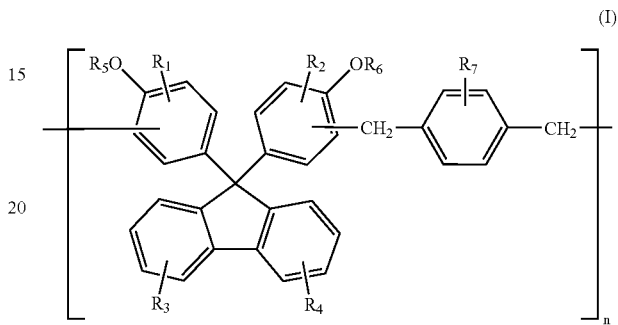

(I)

wherein
$R_1$ and $R_2$ may each independently be hydrogen, hydroxyl, $C_{1-10}$ alkyl, $C_{6-10}$ aryl, allyl, or halo;
$R_3$ and $R_4$ may be each independently be hydrogen, a crosslinking functionality, or a chromophore;
$R_5$ and $R_6$ may each independently be hydrogen or an alkoxysiloxane having the structure of Formula (II), wherein for at least one of the monomeric units of Formula (I), at least one of $R_5$ and $R_6$ is the alkoxysilane of Formula (II);

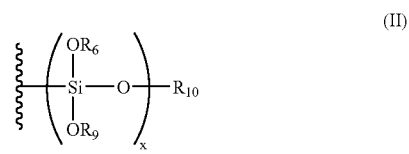

(II)

wherein
$R_8$, $R_9$, and $R_{10}$ may each independently be hydrogen, alkyl, or aryl; and x is 0 or a positive integer;
$R_7$ may be hydrogen, $C_{1-10}$ alkyl, $C_{6-10}$ aryl, or allyl; and n is a positive integer;
(b) a crosslinking component; and
(c) an acid catalyst.

In some embodiments of the present invention, methods of forming a patterned material layer on a substrate include:
(a) forming an antireflective hardmask layer on a material layer, wherein the hardmask layer includes a composition according to an embodiment of the invention;
(b) forming a radiation-sensitive imaging layer on the antireflective layer;
(c) exposing the imaging layer to radiation;
(d) developing the imaging layer and the antireflective layer to expose portions of the material layer; and
(e) etching the exposed portions of the material layer.

In some embodiments of the invention, a semiconductor integrated circuit fabricated according to a method of the invention is provided.

DETAILED DESCRIPTION OF EMBODIMENTS OF THE INVENTION

The invention is described more fully hereinafter. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein:

The term "alkyl" refers to a monovalent straight, branched, or cyclic hydrocarbon radical having from 1 to 12 carbon atoms. In some embodiments, the alkyl may be a "lower alkyl," wherein the alkyl group has 1 to 4 hydrocarbons. For example, lower alkyl may include methyl, ethyl, propyl, iso-propyl, butyl, and iso-butyl, and the like.

The term "aryl" refers to a monovalent aromatic radical, which may optionally include 1 to 3 additional rings (e.g. cycloalkyl) fused thereto. The aryl rings may optionally be substituted, for example, with methyl, phenyl, hydroxyl, epoxy, alkoxy, or ester groups.

The term "$C_x$," wherein x is an integer, will be used herein with reference to alkyl and aryl groups to denote an alkyl or aryl having x number of carbon atoms. Thus, for example, a $C_5$ alkyl refers to any alkyl having five carbon atoms, and a $C_6$-$C_{10}$ aryl refers to any aryl having from 6 to 10 carbon atoms.

The term "allyl" refers to a —$CH_2CH$=$CH_2$ radical.

The term "halo" refers to a halogen radical, for example, —F, —Cl, —Br, or —I.

The term "alkoxysilane group" refers any Si—O—R radical, in which a silicon atom is attached to an alkyl, as defined herein, via an oxygen atom. Exemplary alkoxysilanes groups include tetraethoxysilyl and tetrabutoxysilyl. As used herein, the term alkoxysilane group also includes the radical of Formula (II), wherein $R_8$, $R_9$ and $R_{10}$ may each independently be hydrogen, alkyl, or aryl.

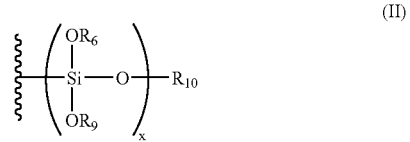

(II)

The term "crosslinking component" refers to a compound, including a polymer, that may react with crosslinking functionalities of polymer(s) of the invention, in order to crosslink the polymer(s). The crosslinks may be formed between one type of polymer, or they may be formed between different types of polymer chains. Exemplary crosslinking components may include etherified amino resins, such as methylated melamine resins and butylated melamine resins [e.g. N-methoxymethyl or N-butoxymethyl melamine resins (available at Cytec Industries, Inc.)]; etherified amino resins, such as methylated urea resins and butylated urea resins (e.g. Cymel U-65 and UFR 80); methylated/butylated glycoluril compounds [e.g. Powderlink 1174 (Cytec Industries, Inc.)]; the compounds described in Canadian Patent No.1,204,547, which is incorporated herein by reference; 2,6-bis(hydroxymethyl)-p-cresol; the compounds described in Japanese Patent Laid-Open No. 1-293339 and bis-epoxy compounds.

The term "acid catalyst" refers to any known acid catalyst, and may be, in some embodiments, a common organic acid, such as p-toluenesulfonic acid monohydrate. In addition, in some embodiments, the acid catalyst may be an acid generator, whereby an acid is produced by under certain conditions. For example, the acid catalyst may be a thermal acid generator (TAG) whereby an acid is generated upon thermal treatment. Exemplary TAGs may include pyridine p-toluenesulfonic acid, 2,4,4,6-tetrabromocyclohexadienol, benzoin tosylate, 2-nitrobenzyl tosylate, and other alkyl esters of organic sulfonic acids. In some embodiments, a photoacid generator (PAG) may be used as the acid catalyst, whereby an acid is produced upon irradiation with a particular radiation source. Exemplary PAGs may include those described in U.S. Pat. Nos. 5,886,102 and 5,939,236, both of which are incorporated herein by reference.

The term "crosslinking functionality" refers to a functional group of a polymer of an embodiment of the invention that is capable of reacting with the crosslinking component to crosslink the polymer(s). Exemplary crosslinking functionalities may include hydroxyl, epoxy, alkoxy, and ester groups.

The term "chromophore" refers to any suitable chromophore, and preferably a chromophore that absorbs radiation at 193 nm and 248 nm. Exemplary chromophores include phenyl, chrysenyl, pyrenyl, fluoranthrenyl, anthronyl, benzophenonyl, thioxanthonyl, anthracenyl, and anthracenyl derivatives that act as chromophores. Exemplary anthracenyl derivatives may include 9-anthracenyl methanol. In some embodiments, the chromophore contains no nitrogen, and, in other embodiments, the only nitrogen present is in the form of a deactivated amino nitrogen, such as a phenol thiazine.

The phrase "any combination thereof" refers to an embodiment where two or more of the recited components are present. When the term "any combination thereof" is used in reference to a listing of possible components, for example, acid catalysts, it is meant that two or more of the recited acid catalysts may be used in combination. Further, when the phrase is used in describing a listing of functional groups, it is meant to include embodiments where both of the functional groups are independently present, if applicable, and also to include embodiments where the functional groups are used in combination. For example, a listing of "hydrogen, hydroxyl, aryl, allyl, halo, and any combination thereof" refers to any suitable combination of the substituents, including, for example, arylalkyl, alkylaryl, hydroxyalkyl, hydroxyaryl, haloalkyl, haloaryl, and the like.

In some embodiments of the present invention, antireflective hardmask compositions include (a) a polymer component including at least one polymer having a monomeric unit of Formula (I)

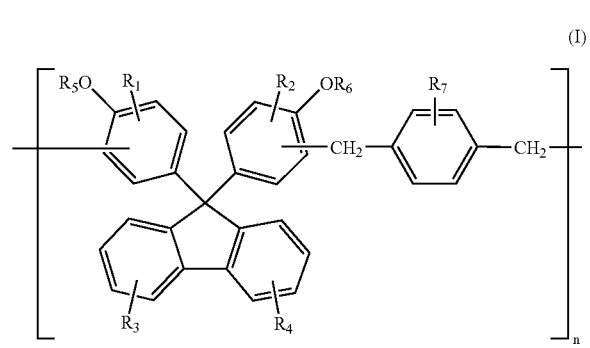

wherein $R_1$ and $R_2$ may each independently be hydrogen, hydroxyl, alkyl, aryl, allyl, halo, or any combination thereof;

$R_3$ and $R_4$ may each independently be hydrogen, a crosslinking functionality, a chromophore, or any combination thereof;

$R_5$ and $R_6$ may each independently be hydrogen or an alkoxysilane group;

$R_7$ may each independently be hydrogen, alkyl, aryl, allyl, or any combination thereof; and n may be a positive integer;

(b) a crosslinking component; and (c) an acid catalyst.

The polymer component may include the monomeric unit of Formula (I) in any proportion, wherein a polymer having a monomeric unit of Formula (I) may be present as a homopolymer, or may be present as a copolymer in any ratio with any other monomeric unit. In copolymers, the monomeric unit of Formula (I) and other copolymerized monomer units may be present in any order, and the order may be random, uniform, or in any other degree of order. A polymer having a monomeric unit of Formula (I) may also be blended with other polymers to form the polymer component. In some embodiments, the polymer component consists of a polymer having a monomeric unit of Formula (I), and in some embodiments, the polymer component consists essentially of a polymer having a monomeric unit of Formula (I).

In some embodiments of the present invention, $R_1$ and $R_2$ may each independently be hydrogen, hydroxyl, $C_{1-10}$ alkyl, $C_{6-10}$ aryl, allyl, or halo;

$R_3$ and $R_4$ may each independently be hydrogen, a crosslinking functionality, or a chromophore;

$R_5$ and $R_6$ are both hydrogen; and $R_7$ may be hydrogen, $C_{1-10}$ alkyl, $C_{6-10}$ aryl, or allyl.

Further, in some embodiments, n may be an integer in a range of 1 to about 190.

In other embodiments of the present invention, $R_1$ and $R_2$ may each independently be hydrogen, hydroxyl, $C_{1-10}$ alkyl, $C_{6-10}$ aryl, allyl, or halo;

$R_3$ and $R_4$ may each independently be hydrogen, a crosslinking functionality, or a chromophore;

$R_5$ and $R_6$ may each independently be hydrogen or an alkoxysiloxane having the structure of Formula (II), wherein for at least one of the monomeric units of Formula (I), at least one of $R_5$ and $R_6$ is the alkoxysilane of Formula (II);

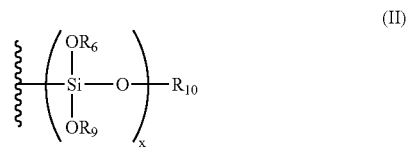

wherein $R_8$, $R_9$, and $R_{10}$ may each independently be hydrogen, alkyl, or aryl; and x is 0 or a positive integer, $R_7$ may be hydrogen, $C_{1-10}$ alkyl, $C_{6-10}$ aryl, or allyl; and n is a positive integer.

In some embodiments, $R_8$, $R_9$, and $R_{10}$ may each independently be methyl, ethyl, $C_{3-10}$ alkyl, or $C_{6-10}$ aryl; and x may be an integer in a range from 1 to about 100.

For some embodiments of the present invention, when the polymer having a monomeric unit of Formula (I) has a molecular weight of less than 5,000 g/mol, the glass transition temperature may be lower than the baking temperature, and thus, intermixing of the hardmask layer and the underlying resist may occur and cause processing defects. However, when the polymer having a monomeric unit of Formula (I) has a molecular weight of greater than 15,000 g/mol, the hardmask composition may have difficulty embedding itself into relatively deep holes, such as contact holes. Thus, in some embodiments, the polymer having a monomeric unit of Formula (I) has a weight average molecular weight in a range of about 5,000 to about 15,000 g/mol. However, in other embodiments of the present invention, the polymer having a monomeric unit of Formula (I) has a weight average molecular weight in a range of about 1,000 to about 30,000 g/mol.

Further, in some embodiments of the present invention, when the polymer having a monomeric unit of Formula (I) has a polydispersity lower than 1.5, the manufacturing yield may be low. However, when the polymer having a monomeric unit of Formula (I) has a polydispersity of greater than 2.5, difficulties in crosslinking the composition may occur, volatile components may form during baking, and it may be difficult to achieve desirable pattern characteristics and margins. Therefore, in some embodiments of the invention, the polydispersity of the polymer having a monomeric unit of Formula (I) is in a range of about 1.5 to about 2.5.

In some embodiments of the present invention, the antireflective hardmask composition includes about 1 to about 20% by weight of the polymer component, about 0.1 to about 5% by weight of the crosslinking component, and about 0.001 to about 0.05% by weight of the acid catalyst. The remaining weight percent of the composition includes a solvent, and in some embodiments, a surfactant. Exemplary solvents include solvents that are commonly used with resists, such as propylene glycol monomethyl ether acetate.

In some embodiments, the polymer component contains about 1 weight percent or less of unreacted monomer.

In some embodiments of the present invention, the chromphore may be phenyl, chrysenyl, pyrenyl, fluoranthrenyl, anthronyl, benzophenonyl, thioxanthonyl, anthracenyl, anthracenyl derivatives, or any combination thereof.

In some embodiments of the present invention, the crosslinking functionality may be an epoxy, ester, alkoxy, or a hydroxyl group.

In some embodiments of the present invention, the crosslinking component may be a melamine resin, an amino resin, a glycoluril compound, a bis-epoxy compound, or any combination thereof.

The acid catalyst may catalyze the crosslinking of the crosslinking component with the crosslinking functionality of a polymer of an embodiment of the invention. In some embodiments, the acid catalyst may be p-toluenesulfonic acid monohydrate, pyrididium p-toluenesulfonate, 2,4,4,6-tetrabromocyclohexadienone, an alkyl ester of an organic sulfonic acid, or any combination thereof. In some embodiments, the alkyl ester of an organic sulfonic acid may be benzoin tosylate, 2-nitrobenzyl tosylate, or any combination thereof.

In some embodiments of the present invention, methods of forming a patterned material layer on a substrate include:

(a) forming an antireflective hardmask layer on a material layer, wherein the hardmask layer includes a composition according to an embodiment of the invention;

(b) forming a radiation-sensitive imaging layer on the antireflective layer;

(c) exposing the imaging layer to radiation;

(d) developing the imaging layer and the antireflective layer to expose portions of the material layer; and (e) etching the exposed portions of the material layer.

In some embodiments of the invention, the method may be carried out in accordance with the following procedure. First, a material to be patterned (e.g., an aluminum or silicon nitride) may be formed onto a silicon substrate by any technique known in the art. A hardmask composition according to an embodiment of the present invention may then be spin-coated onto the material. The composition may be spin-coated, for example, to a thickness in a range of about 500 to about 4000 Å. The hardmask composition may then be baked, for example, at a temperature in the range of about 100 to about 300° C., for a time in a range of about 10 seconds to about 10 minutes, to form a hardmask layer. A radiation-sensitive imaging layer may then be formed on the hardmask layer. The imaging layer may then be developed by exposing portions of the resist to radiation in order to form a pattern on the imaging layer. The imaging layer and the antireflective hardmask layer may then be selectively removed to expose portions of the material layer. Etching may then be performed. In some embodiments, dry etching is performed using a gas, for example, a $CHF_3/CF_4$ mixture. After the formation of a patterned material layer, the remaining portions of the resist may then be removed using a common photoresist stripper.

Accordingly, hardmask compositions of the present invention and the resulting lithographic structures may be used in the fabrication and design of integrated circuit devices in semiconductor manufacture. The compositions and methods of embodiments of the present invention may be used, for example, in the formation of patterned material structures, such as metal wirings, holes for contacts and biases, insulating sections (e.g. damascene trenches and shallow trench isolation), and trenches for capacitor structures. Thus, in some embodiments of the invention, a semiconductor integrated circuit fabricated according to a method of the invention is provided.

The present invention will now be described in more detail with reference to the following examples. However, these examples are given for the purpose of illustration only and are not to be construed as limiting the scope of the invention.

EXAMPLE 1

Synthesis of Compound 1

8.31 g (0.05 mol) of 1,4-bis(methoxymethyl)benzene, 0.154 g (0.001 mol) of diethyl sulfate, and 200 g of γ-butyrolactone were stirred in a 1 L four-neck flask equipped with a mechanical agitator, a condenser, a 300 mL dropping funnel, and nitrogen feed tube, for 10 minutes while nitrogen gas is supplied to the flask. A solution of 28.02 g (0.08 mol) of 4,4'-(9-fluorenylidene)diphenol in 200 g of γ-butyrolactone was slowly added dropwise for 30 minutes. The mixture was allowed to react for 12 hours. After completion of the reaction, the acid was removed using water, followed by concentration by an evaporator. Subsequently, the concentrate was diluted with methyl n-amyl ketone (MAK) and methanol (MeOH) to obtain a 15 wt % solution in MAK/MeOH (4:1, w/w). The solution thus obtained was transferred to a 3 L separatory funnel, and then n-heptane was added thereto to remove low molecular weight compounds containing unreacted monomers, yielding the desired phenol resin ($M_w$=12, 000, PDI=2.0, n=23).

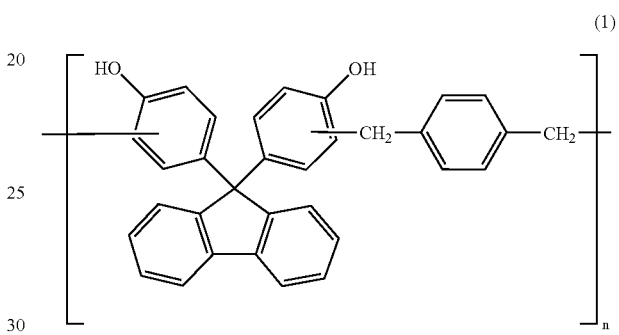

(1)

Synthesis of Compound 2

75 g of compound 1 and 25 g of a poly(alkoxysilane) (MS51, Mitsubishi Chemical) were dissolved in 600 g of propyleneglycol monoethylacetate (PGMEA) in a 1 L four-neck flask equipped with a mechanical agitator, a condenser, a 300 mL dropping funnel, and nitrogen feed tube, while nitrogen gas is supplied to the flask. Then, 2 g of p-toluenesulfonic acid monohydrate was added thereto. After the temperature was raised to 120° C., the reaction mixture was stirred for 30 minutes. Thereafter, the temperature was raised to 150° C., followed by stirring for 2 hours. After the resulting mixture was allowed to cool to room temperature, 1,300 g of PGMEA was added, stirred for 30 minutes, and filtered, yielding the desired polymer, Compound 2 (wherein R is partially substituted with the poly(alkoxysilane)).

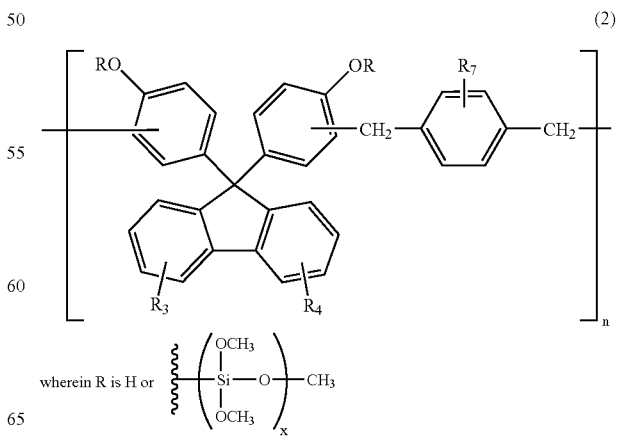

(2)

COMPARATIVE EXAMPLE 1

0.80 g of Compound 1, 0.2 g of an oligomeric crosslinking agent (Powderlink 1174) consisting of the repeating units shown below, and 2 mg of pyridinium p-toluenesulfonate were dissolved in 9 g of PGMEA and filtered to prepare a sample solution. The structure of the Powderlink 1174 crosslinker is shown below.

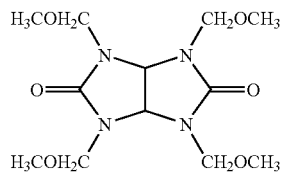

Comparison of Refractive Index (n) and Extinction Coefficient (k) After Application to Silicon Wafer The polymers of Compound 2 and Comparative Example 1 were spin-coated onto a silicon wafer and baked at 200° C. for 60 second to form a 1,500 Å thick film. The refractive index (n) and extinction coefficient (k) of the films formed from Compound 2 and Comparative Example 1 were measured using an ellipsometer (J. A. Woolam). The results are shown in Table 1.

TABLE 1

| Samples used in formation of films | Optical properties (193 nm) | | Optical properties (248 nm) | |
|---|---|---|---|---|
| | Refractive index (n) | Extinction coefficient (κ) | Refractive index (n) | Extinction coefficient (κ) |
| Compound 2 | 1.38 | 0.67 | 1.97 | 0.26 |
| Comparative Example 1 | 1.44 | 0.80 | 2.02 | 0.27 |

Each of the sample solutions prepared for Compound 2 and Comparative Example 1 was spin-coated onto an aluminum-deposited silicon wafer and baked at 200° C. for 60 seconds to form a 1,500 Å thick film. A photoresist for KrF was coated onto the film, baked at 110° C. for 60 seconds, light-exposed using an exposure system manufactured by ASML (XT:1400, NA=0.93), and developed with tetramethylammonium hydroxide (TMAH, 2.38 wt % aqueous solution) to form an 90 nm line and space pattern. The 90 mn line and space pattern was observed using an FE-SEM, and the obtained results are shown in Table 2 below. Exposure latitude (EL) margin according to the changes in exposure energy and depth of focus (DoF) margin according to the changes in the distance from a light source were measured.

The results are shown in Table 2.

TABLE 2

| | Pattern characteristics | |
|---|---|---|
| Samples used in formation of films | EL margin (Δ mJ/exposure energy mJ) | DoF Margin (μm) |
| Compound 2 | 0.2 | 0.2 |
| Comparative Example 1 | 0.2 | 0.2 |

The patterned specimens were dry-etched using a mixed gas of $CHF_3/CF_4$, and further dry-etched using a mixed gas of $BCl_3/Cl_2$. Finally, all remaining organic materials were removed using $O_2$, and a cross section of the specimens was observed using an FE-SEM. The results are shown in Table 3.

TABLE 3

| Samples used in formation of films | Pattern shape after etching |
|---|---|
| Compound 2 | Vertical |
| Comparative Example 1 | Tapered |

Compound 2 and Comparative Example 1 specimens were dry-etched using a mixed gas of $CHF_3/CF_4$, and the thickness difference before and after the dry etching was measured. The results are shown in Table 4.

TABLE 4

| Samples used in formation of films | Etching rate of $CHF_3/CF_4$ gas (nm/min) |
|---|---|
| Compound 2 | 70 |
| Comparative Example 1 | 110 |

Each of the sample solutions of Compound 2 and Comparative Example 1 was spin-coated onto a silicon nitride (SiN)-coated silicon wafer and baked at 200° C. for 60 seconds to form a 1,500 Å thick film.

A photoresist for ArF was coated onto the film, baked at 110° C. for 60 seconds, light-exposed using an ArF exposure system (ASML1250, FN70 5.0 active, NA=0.82), and developed with TMAH (2.38 wt % aqueous solution) to form an 80 nm line and space pattern. The 80 nm line and space pattern was observed using an FE-SEM, and the obtained results are shown in Table 5 below. Exposure latitude (EL) margin according to the changes in exposure energy and depth of focus (DoF) margin according to the changes in the distance from a light source were measured and recorded. The results are shown in Table 5.

TABLE 5

| | Pattern characteristics | |
|---|---|---|
| Samples used in formation of films | EL margin (Δ mJ/exposure energy mJ) | DoF Margin (μm) |
| Compound 2 | 0.2 | 0.2 |
| Comparative Example 1 | 0.2 | 0.2 |

The patterned specimens were dry-etched using a mixed gas of $CHF_3/CF_4$, and further dry-etched using a mixed gas of $CHF_3/CF_4$ with a different selectivity. Finally, all remaining organic materials were removed using $O_2$, and the cross section of the specimens was observed using an FE-SEM. The results are shown in Table 6.

TABLE 6

| Samples used in formation of films | Pattern shape after etching |
|---|---|
| Example 1 | Vertical |
| Comparative Example 1 | Tapered |

As apparent from the above description, compositions of the present invention may provide hardmask layers having excellent optical properties, superior mechanical properties, and high etch selectivity. In addition, in some embodiments, the compositions may be easily applied by spin-coating techniques. Further, in some embodiments, the compositions may possess superior storage life and contain few or no acid pollutants.

Although the particular embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An antireflective hardmask composition, comprising:
    (a) a polymer component comprising at least one polymer comprising a monomeric unit of Formula (I)

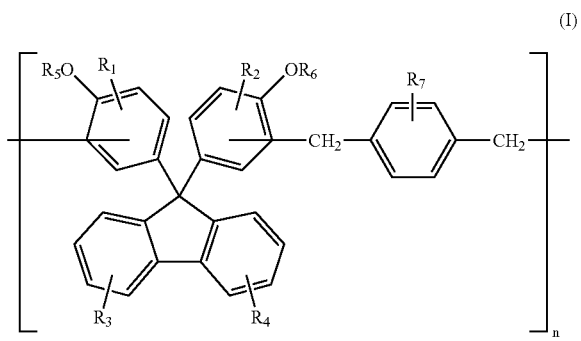

wherein
  $R_1$ and $R_2$ are each independently selected from the group consisting of hydrogen, hydroxyl, $C_{1-10}$ alkyl, $C_{6-10}$ aryl, allyl, and halo;
  $R_3$ and $R_4$ are each independently selected from the group consisting of hydrogen, a crosslinking functionality, and a chromophore;
  $R_5$ and $R_6$ are each independently selected from the group consisting of hydrogen and an alkoxysiloxane having the structure of Formula (II), wherein for at least one of the monomeric units of Formula (I), at least one of $R_5$ and $R_6$ is the alkoxysilane of formula (II);

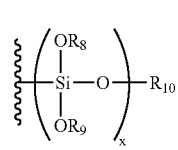

wherein
  $R_8$, $R_9$, and $R_{10}$ are each independently selected from the group consisting of hydrogen, alkyl, and aryl; and x is 0 or a positive integer;
  $R_7$ is selected from the group consisting of hydrogen, $C_{1-10}$ alkyl, $C_{6-10}$ aryl, and allyl; and
  n is a positive integer;
    (b) a crosslinking component; and
    (c) an acid catalyst.

2. The antireflective hardmask composition of claim 1, wherein $R_8$, $R_9$, and $R_{10}$ are each independently selected from the group consisting of methyl, ethyl, $C_{3-10}$ alkyl, and $C_{6-10}$ aryl; and x is an integer from 1 to about 100.

3. The antireflective hardmask composition of claim 1, comprising
  about 1 to about 20% by weight of the polymer component;
  about 0.1 to about 5% by weight of the crosslinking component; and
  about 0.001 to about 0.05% by weight of the acid catalyst.

4. The antireflective hardmask composition of claim 1, wherein the polymer comprising the monomeric unit of Formula I has a weight average molecular weight of about 1,000 to about 30,000 g/mol.

5. The antireflective hardmask composition of claim 1, further comprising a solvent.

6. The antireflective hardmask composition of claim 1, further comprising a surfactant.

7. The antireflective hardmask composition of claim 1, wherein the chromophore is selected from the group consisting of phenyl, chrysenyl, pyrenyl, fluoranthrenyl, anthronyl, benzophenonyl, thioxanthonyl, anthracenyl, anthracenyl derivatives, and any combination thereof.

8. The antireflective hardmask composition of claim 1, wherein the crosslinking functionality is selected from the group consisting of epoxy, ester, alkoxy, and hydroxyl.

9. The antireflective hardmask composition of claim 1, wherein the crosslinking component is selected from the group consisting of a melamine resin, an amino resin, a glycoluril compound, a bisepoxy compound, and any combination thereof.

10. The antireflective hardmask composition of claim 1, wherein the acid catalyst is selected from the group consisting of p-toluenesulfonic acid monohydrate, pyrididium p-toluenesulfonate, 2,4,4,6-tetrabromocyclohexadienone, an alkyl ester of an organic sulfonic acid, and any combination thereof.

11. The composition of claim 10, wherein the alkyl ester of an organic sulfonic acid is selected from the group consisting of benzoin tosylate, 2-nitrobenzyl tosylate, and any combination thereof.

12. A method of forming a patterned material layer on a substrate, comprising
    (a) forming an antireflective hardmask layer on a material layer, wherein said hardmask layer comprises the composition according to claim 1;
    (b) forming a radiation-sensitive imaging layer on the antireflective layer;
    (c) exposing the imaging layer to radiation;
    (d) developing the imaging layer and the antireflective layer to expose portions of the material layer; and
    (e) etching the exposed portions of the material layer.

* * * * *

UNITED STATES PATENT AND TRADEMARK OFFICE
CERTIFICATE OF CORRECTION

PATENT NO.        : 7,405,029 B2                                                    Page 1 of 1
APPLICATION NO.   : 11/325281
DATED             : July 29, 2008
INVENTOR(S)       : Oh et al.

It is certified that error appears in the above-identified patent and that said Letters Patent is hereby corrected as shown below:

On Title Page:

Item 73, Assignee: Please Correct "Cheil Industrial, Inc. (KR)"
                              to read: -- Cheil Industrials, Inc. (KR) --

Signed and Sealed this

Twenty-fifth Day of November, 2008

JON W. DUDAS
*Director of the United States Patent and Trademark Office*